March 14, 1972 F. Z. HAWRYLO 3,649,382

DOUBLE EPITAXIAL SOLUTION REGROWTH PROCESS AND DEVICE MADE THEREBY

Filed Feb. 26, 1968 2 Sheets-Sheet 1

INVENTOR
FRANK Z. HAWRYLO
BY
ATTORNEY

Fig. 8
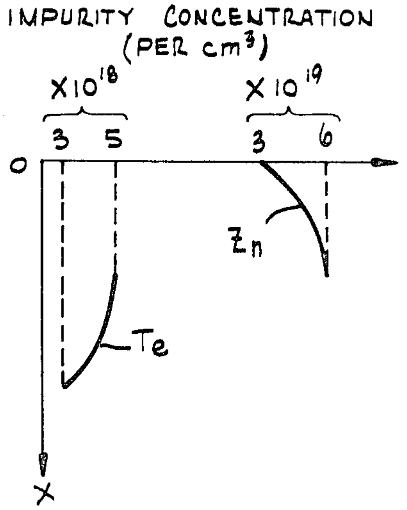
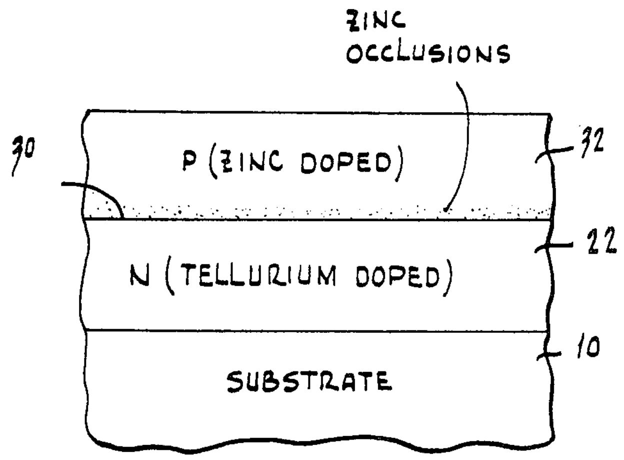
Fig. 7
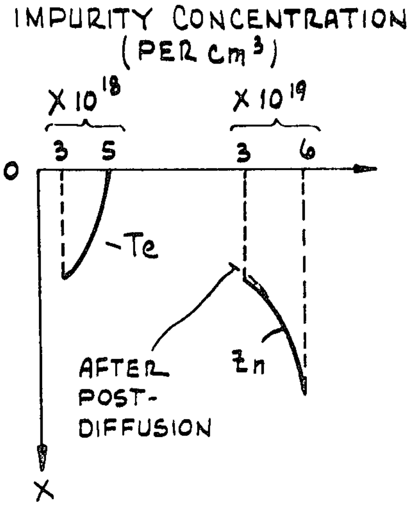
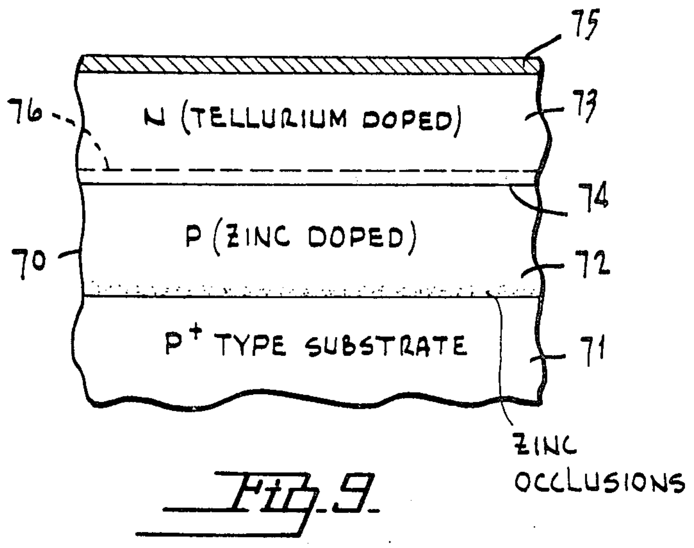
Fig. 9
Fig. 10
INVENTOR
FRANK Z. HAWRYLO
BY
ATTORNEY United States Patent Office 3,649,382
Patented Mar. 14, 1972

3,649,382

DOUBLE EPITAXIAL SOLUTION REGROWTH PROCESS AND DEVICE MADE THEREBY

Frank Z. Hawrylo, Trenton, N.J., assignor to RCA Corporation

Continuation-in-part of application Ser. No. 544,934, Apr. 25, 1966. This application Feb. 26, 1968, Ser. No. 708,324
Int. Cl. H01l 7/38; H05b 33/00; B01j 17/00
U.S. Cl. 148—171 4 Claims

ABSTRACT OF THE DISCLOSURE

A process for manufacturing a semiconductor laser diode by depositing from the liquid phase successive P type and N type gallium arsenide epitaxial layers with a P–N junction therebetween. The N type layer is grown by precipitation from a gradually cooled melt of gallium arsenide and tellurium in a gallium solvent. The P type layer is deposited by precipitation from a slowly cooled melt of gallium arsenide and zinc in a gallium solvent. While the layers may be deposited in either order, improved ohmic contacts and reproducibility of device parameters are obtained by depositing the P type layer first.

RELATED APPLICATIONS

This application is a continuation-in-part of U.S. patent application Ser. No. 544,934 (now abandoned), filed Apr. 25, 1966, and assigned to the assignee of the instant application.

BACKGROUND OF THE INVENTION

This invention relates generally to semiconductor devices, and more particularly to an improved P–N junction and a novel method of making it. The improved P–N junction and novel method of making it are particularly useful for providing improved injection lasers of the GaAs (gallium arsenide) type.

It has been proposed to make a GaAs laser diode by depositing, from the vapor phase, an epitaxial GaAs layer of one conductivity type on a GaAs wafer of an opposite conductivity type, the wafer having been cut from a single crystal that is either a boat-grown crystal or a Czochralski-grown crystal. Te (tellurium), the desired N type dopant for GaAs, should be present in the N type wafer in a concentration of about 2 to $4\times10^{18}$ cm.$^{-3}$; however, at the melting point of GaAs, the saturation solubility of Te in GaAs is relatively low.

Thus, the introduction of this high concentration of Te dopant into a melt of GaAs during crystal growth tends to cause defects in the crystal lattice of the resultant doped GaAs crystal. It is, therefore, difficult to provide suitably doped (boat-grown or Czochralski-grown) GaAs crystals that meet the requirements for both high doping and high crystalline quality, requirements necessary for efficient lasing in a laser diode.

Hence, less than 10% of the laser diodes of the GaAs type made by the prior art method, utilizing wafers cut from boat-grown or Czochralski-grown crystals, have been satisfactory.

It is an object of the present invention to provide an improved P–N junction, and a novel method of making it from doped regions, that overcomes the aforementioned objections to those formed with boat-grown or Czochralski-grown crystals.

Another object of the invention is to provide an improved P–N junction semiconductor device, and a novel method of making it, that may utilize an initial substrate of only fair crystalline quality.

Still another object of the invention is to provide a novel method of making a P–N junction semiconductor device formed from highly doped regions while utilizing relatively low temperatures to produce regions of high crystalline quality.

SUMMARY OF INVENTION

The improved P–N junction is formed between highly doped P type and N type epitaxial layers grown successively from the liquid phase on a GaAs substrate. According to the preferred embodiment of my invention, the N type epitaxial layer is deposited by preparing a pre-heated solution comprising Ga (gallium), GaAs, and Te, and allowing the solution to cool to precipitate the N type layer onto an underlying semiconductor surface. Similarly, the P type epitaxial layer is deposited on an underlying semiconductor surface from a pre-heated solution comprising Ga, GaAs and Zn (zinc), by precipitation as the solution cools.

In the drawing:

FIG. 7 is an expanded front elevational view of a portion of the structure shown in FIG. 3;

FIG. 8 is a graph showing the impurity concentration distribution within the active portion of the structure shown in FIG. 7;

FIG. 9 shows a front elevational view of a laser diode according to another embodiment of the invention; and FIG. 10 is a graph showing the impurity concentration distribution in the active portion of the device shown in FIG. 9.

DETAILED DESCRIPTION

Figure 6:
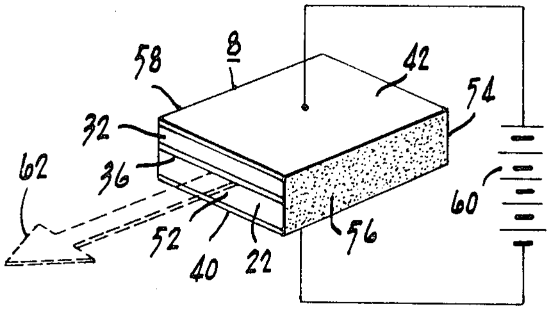
FIG. 6 is a perspective view, partly schematic, of an improved laser diode made by a method according to the invention and connected to a source of voltage.

The improved P–N junction, as utilized in the improved GaAs laser diode 8, shown in FIG. 6, is produced by forming highly doped N type and P type regions of excellent crystalline formation by liquid-phase epitaxy. Advantage is taken of the fact that the saturation solubility of Te in GaAs is high at the relatively low temperatures employed for epitaxial growth from a liquid phase system.

Figure 1:
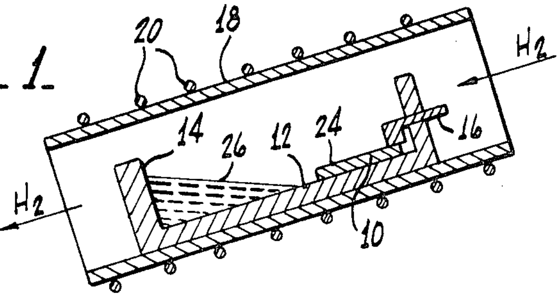
FIG. 1 is a schematic drawing of apparatus useful in the practice of the invention.

Referring now to FIG. 1 of the drawing, there is shown apparatus for making the improved P–N junction. A substrate of semiconductor material, in the form of a wafer 10, is disposed firmly on the floor 12 of a boat 14 by any suitable means, such as by a clamp 16. The wafer 10 may be of either N type, P type, or intrinsic GaAs, having a thickness of about 20 mils and opposite major surfaces of about 500 mils square. The boat 14 is made from relatively chemically inert refractory material, such as graphite or the like.

The boat 14 is inserted in a refractory furnace tube 18, such as a quartz tube, and heating means, such as a coil of wire 20, is wound around the tube 18 to heat the latter electrically in a manner well known in the art. A stream of a non-oxidizing gas, such as hydrogen, helium, nitrogen, or mixtures thereof, is passed through the furnace tube 18 so that the reactions therein can be performed in a non-oxidizing ambient.

It is desired to grow a highly doped N type epitaxial layer 22 of high crystalline quality on the upper surface 24 of the wafer 10. To this end, the surface 24, preferably parallel to the (100) or (111) crystal plane of the wafer 10, is cleaned by lapping, polishing, and etching by any suitable means. For example, the surface 24 may be lapped with an abrasive, such as $Al_2O_3$ or carborundum, polished with sodium hypochlorite and a silk cloth, and etched with a suitable etchant.

Figure 2:
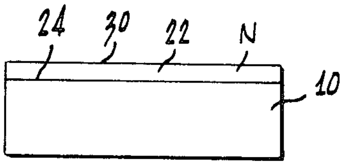
FIGS. 2–5 are front elevational views of doped regions of GaAs, showing successive steps in a method according to the invention.

A mixture consisting of components in the proportions of 8 grams Ga, 1.2 grams GaAs, and 4 milligrams Te, adapted to form a solution 26 when molten, is heated in the boat 14 to a temperature of between 880° C. and 920° C. while the furnace tube 18 is tilted so that the solution 26 is out of contact with the wafer 10. Where the cost of gallium is not critical, the mixture may preferably be in the proportions of 25 grams Ga, 5 grams GaAs, and 9 milligrams Te. When the solution 26 reaches a temperature between 880° C. and 920° C., the mixture melts and the tube is tilted (clockwise looking at FIG. 1) so that the solution 26 is disposed over the upper major surface 24 of the wafer 10. The heating of the furnace tube 18 is now discontinued, and the solution 26 is allowed to cool to a temperature of about 400° C. A thermocouple thermometer (not shown) may be used to gauge the temperature of the solution 26. During this cooling period (920° C. to 400° C.), GaAs is initially dissolved from the surface 24 by the solution 26 and then crystallized from the solution 26 to form an epitaxially grown N type layer 22 as shown in FIG. 2.

After the solution 26 has cooled to the temperature of about 400° C., the furnace tube 18 is tilted back to its original position, as shown in FIG. 1, removing the bulk of the solution 26 from the wafer 10 and leaving thereon the epitaxially deposited N type layer 22 of monocrystalline GaAs doped with Ie. The number of Te donor atoms in the layer 22 so formed is in the order of $10^{18}$ cm.$^{-3}$. If the surface 24 of the wafer 10 is 500 mils square, the N type layer 22 of doped GaAs crystallized initially onto the wafer 10 from the solution 26 (of the components in the quantities specified) is about 4 mils in thickness.

If it is desired to make a laser diode of the type shown in FIG. 6, the major surface 24 of the GaAs wafer 10 should be parallel to either the (100) or (111) crystal plane of GaAs because the layers to be grown thereon can then be cleaved at right angles to provide parallel mirror planes. It has been observed that even though the crystal structure of the monocrystalline wafer 10 may be only of fair crystalline quality, the epitaxial layer 22 grown on the (100) or (111) plane surface 24 of the wafer 10 is nevertheless of very high crystalline quality and contains the required doping for use in a diode laser, as will hereinafter be explained.

The upper surface 30 of the layer 22 is cleaned as with a "Teflon" wiper and washed in boiling concentrated hydrochloric acid. The surface 30 is also lapped until the thickness of the layer 22 is between 2½ and 3½ mils. The surface 30 is also polished and etched by any suitable means, as, for example, described for the surface 24.

Figure 3:
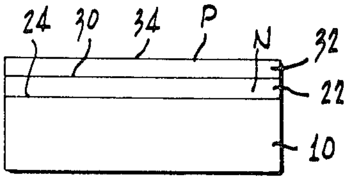

It is now desired to deposit a P type layer 32 (FIG. 3) of GaAs on the cleaned surface 30 by the improved method. To this end, a mixture of components in the proportions of 8 grams Ga, 1.8 grams GaAs, and about 0.5 gram Zn is heated to form a molten solution, as described for the solution 26, in the boat 14. Alternatively, where economics permit, the mixture may be in the porportions of 25 grams Ga, 5 gram GaAs and 0.5 gram Zn. When the solution reaches a temperature of between 910° C. and 950° C., the furnace tube 18 is tilted (clockwise looking at FIG. 1), so that the solution covers the surface 30 of the layer 22. Heat is now removed from the tube 18, and the solution is allowed to cool to about 400° C. At about 400° C., the furnace tube 18 is tilted back to its original position, as shown in FIG. 1. During the cooling of the solution (from 950° C. to 400° C.), the highly doped, monocrystalline layer 32 of excellent crystalline quality deposits to a thickness of about 4 mils. The upper surface 34 of the layer 32 is now cleaned, lapped, polished, and etched, as described for the surface 30 of the layer 22.

Figure 4:
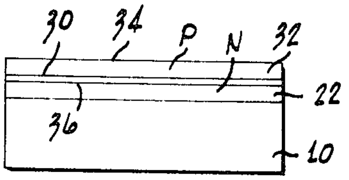

By depositing the N type layer 22 first, and then depositing the P layer 32 on the cleaned surface 30 of the N type layer 22, the original surface 30 becomes a PN junction between the layers 22 and 32. The surface 30 is considered the mechanical PN junction between the layers 22 and 32. To make an efficient laser diode, however, a postdiffusion of the layers 22 and 32 has been found desirable to interdiffuse the Zn from P type layer 32 into the N type layer 22. This is accomplished by heating the layers 22 and 32 between 900° C. and 975° C. for a period of between ½ and 4 hours. During this time, the Zn from the layer 32 diffuses into the layer 22 to form a PN junction 36 (FIG. 4) displaced a distance of about 2 microns from the mechanical PN junction 30. During the interdiffusion heating period, however, substantially no Te diffuses from the N type layer 22 into the P type layer 32.

By sufficiently gradual cooling of the last grown epitaxial layer during the solution growth process, the diffusion of zinc into the N type layer may be accomplished without resort to a separate heat treatment step.

The P type layer 32 is now lapped and polished until it has a thickness of between 0.5 mil and 1 mil for the purposes hereinafter appearing. The substrate wafer 10 is removed, as by lapping, and the layer 22 is lapped to a thickness of about 3 mils so that the overall thickness of the combined layers 22 and 32 is about 4 mils.

In making a laser diode, if the substrate wafer 10 is of the same conductivity type as that of the layer 22, and if the wafer 10 is sufficiently doped, the wafer need not be removed because it may form part of the electrical contact to the layer 22. On the other hand, if the substrate wafer 10 is of an opposite conductivity type to that of the layer 22, the wafer must be removed because it forms a PN junction with the layer 22 that is oppositely biased with respect to the PN junction 36.

The exposed major surfaces of the lapped layers 22 and 32 are now metallized. This may be accomplished by evaporating Sn (tin) on a heated (550° C.), lapped, major surface 38 (FIG. 5) of the layer 22. The major surfaces of the layers 22 and 32 are coated with nickel, as with an electroless nickel solution, and then coated with gold, as with an electroless gold solution, providing an ohmic metal electrode 40 on the major surface 38 of the layer 22 and an ohmic metal electrode 42 on a lapped major surface 44 of the layer 32.

Figure 5:
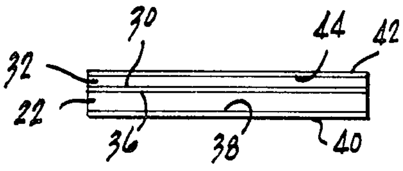

The improved laser diode 8 (FIG. 6) with excellent operating characteristics can be obtained by cleaving the semiconductor device of FIG. 5 along the (110) plane to obtain parallel mirror surfaces 52 and 54. The surfaces 52 and 54 are perpendicular to the PN junction 36. The parallel surfaces 52 and 54 may be spaced apart a distance of between 10 and 50 mils.

Opposite parallel surfaces 56 and 58 of the device 8, perpendicular to the mirror surfaces 52 and 54, are obtained by sawing and roughening these sides so that they do not function as mirrors. The surfaces 56 and 58 may be preferably between 3 and 5 mils apart.

When a source 60 of voltage is applied between the metal electrodes 40 and 42 on the layers 22 and 32, respectively, so that current flows through the diode 8, coherent light in the infrared (about 8500 A.) region is emitted (as indicated by the arrow 62) from the PN junction 36 if the current through the diode 8 is high enough and if the temperature of the diode 8 is suitable. At the temperature of liquid nitrogen, laser diodes made by my method exhibited lasing thresholds of less than 1,000 ampers/cm.$^2$. At room temperature, laser diodes made by my method exhibited lasing thresholds of about ½ that of laser diodes made by prior art methods.

The improved operation of the laser diode 8 made by my method is believed due to the fact that the saturation solubility of Te in a GaAs-Ga solution is high at the relatively low temperatures (880° C.–92° C.) employed in the epitaxial growth of the N type layer 22 from the liquid phase. The desired Te concentration of about 2 to $4 \times 10^{18}$ cm.$^{-3}$ is far below the saturation solubility in the solution at this temperature. Therefore, the introduction of this relatively high concentration of Te into GaAs during the epitaxial growth from the liquid phase does not tend to cause disturbances in the formation of the crystal lattice of GaAs.

On the other hand, at the melting point (1250° C.) of GaAs, by way of contrast, the saturation solubility of Te is relatively low (due to the retrograde solubility vs. temperature characteristic of Te) and the introduction of high concentrations of Te from the vapor phase tends to be associated with the formation of defects in the crystals lattice. Consequently, PN junctions formed by N type and P type regions deposited successively from the liquid phase of solutions are superior to those provided by the prior art, vapor phase methods and meet the requirements for both high doping and high crystalline quality. Hence, substantially all GaAs laser diodes made by the novel method are acceptable high quality lasers, in contrast to less than 10% of the laser diodes made by the aforementioned prior art methods.

Although the laser diode 8 made by depositing a P type epitaxial layer atop an N type epitaxial layer, provides substantially improved performance in comparison with prior art laser diodes, substantial variations in device parameters have been observed between wafers processed at different times. I have discovered that by utilizing the process described above to deposit the P type epitaxial layer first, and the N type epitaxial layer on the P type layer, a very considerable improvement in reproducibility of device parameters is obtained. The basis for this improvement will be understood from the following discussion based upon FIGS. 7 through 10.

Zinc, the acceptor impurity utilized in depositing the P type epitaxial layer, exhibits a normal solubility vs. temperature characteristic in the gallium/gallium arsenide melt. That is, the solubility of zinc increases with increasing temperature in this melt. Therefore, as the zinc is precipitated from the melt by gradual cooling thereof, the greatest concentration of zinc occurs in the initial deposit, since the initial deposit occurs while the melt is at its highest temperature. As the melt cools and the thickness of the deposit increases, the solubility of zinc in the melt drops, so that the concentration of zinc in the deposited layer increases as the thickness of the layer increases.

In contradistinction, tellurium exhibits a retrograde solubility vs. temperature characteristic in a gallium/gallium arsenide melt. That is, the solubility of tellurium in the melt decreases with increasing temperature. Therefore, when the N type layer (in which tellurium is the donor impurity material) is deposited by precipitation upon slow cooling of the melt, the initially deposited portion of the N type layer contains a lower concentration of tellurium than the portion of the N type layer subsequently deposited. That is, as the thickness of the N type layer increases, the tellurium concentration likewise increases.

The net result of the normal solubility characteristic of zinc in conjunction with the retrograde solubility characteristic of tellurium produces the impurity concentration profile shown in FIG. 8. The graph of FIG. 8 is situated in alignment with the structure shown in FIG. 7, which represents an enlarged view of a portion of the structure of FIG. 3, so that the $x$-axis represents depth from the upper surface of the P type layer, while the other axis of the graph represents the corresponding donor (tellurium) or acceptor (zinc) impurity concentration.

It is evident from the graph that the impurity concentration is at a maximum immediately adjacent the P–N junction region 30 and decreases with distance in both directions away from the junction region.

Due to the extremely high solubility of zinc in the melt, when the epitaxial P type layer 32 is deposited, the initial portion of this layer contains localized metallic regions of zinc occlusion. These occlusion regions, being present in the immediate vicinity of the P–N junction 30, introduce irregularities in the electrical characteristics of the junction and account for a substantial part of the differences between device parameters observed in wafers prepared at different times.

By interchanging the order in which the epitaxial layers 22 and 32 are deposited, a substantial improvement in reproducibility of electrical parameters is realized. In the interchanged structure, one embodiment of which is shown in FIG. 9, the P type epitaxial layer is deposited by slow cooling of a melt containing gallium arsenide, zinc and gallium in the respective relative proportions of 5:0.5:25 by weight. The melt is initially heated to a temperature between 910° C. and 950° C., preferably 930° C., applied to the $P^+$ type substrate 71, and gradually cooled to deposit the P type epitaxial layer 72.

While the melt need only be cooled to a temperature below approximately 400° C. before deposition of the N type epitaxial layer 73, preferably the melt should be cooled to room temperature before proceeding with further fabrication steps.

After the epitaxial layer 72 has been deposited, the melt is removed from the immediate vicinity thereof, the epitaxial layer 72 is cleaned and otherwise prepared as previously described for the N type epitaxial layer 22.

The N type epitaxial layer 73 is then deposited on the P type layer 72 by gradual cooling of a melt comprising gallium arsenide, tellurium and gallium in the respective relative proportions of 5:0.009:25 by weight. This melt is initially heated to a temperature between 880° C. and 920° C., preferably 900° C., and gradually allowed to cool to a temperature at least below approximately 400° C., but preferably to room temperature.

It is in most cases desirable to drive the P–N junction from the mechanical interface 74 between the epitaxial layers 72 and 73, to a plane 76 a few microns within the N type epitaxial layer 73. To this end, a heat treatment step utilizing the aforementioned post-diffusion temperature-time parameters may be employed. After surface cleaning, a tin layer 75 is evaporated to serve as an electrode to the N type epitaxial layer 73. The $P^+$ substrate 71 serves as an electrode to the P type region 72.

The excellent and readily reproducible characteristics of the laser diode 70 shown in FIG. 9 are accounted for by (i) the fact that the zinc occlusions now occur in the region adjacent the interface between the P type epitaxial layer 72 and the $P^+$ substrate 71, where they do not introduce any significant deleterious electrical effects, and (ii) the relatively high impurity concentration and consequent low resistivity of the semiconductor material adjacent each of the electrodes 71 and 75.

The latter effect may be seen from an examination of FIG. 10, in which the impurity concentration in the active portion of the laser diode 70 is plotted against depth below the upper surface of the N type region 73, the depth or $x$-axis of the graph being aligned with the structure shown in FIG. 9.

The graph of FIG. 10 indicates that the normal solubility characteristic of zinc results in the P type layer 72 having an impurity distribution such that maximum impurity concentration occurs in the initially deposited portion of the layer at the interface between the epitaxial layer 72 and the underlying substrate 71.

Similarly, the retrograde soluibility characteristic of tellurium imparts to the N type epitaxial layer 73 an impurity concentration distribution such that the initially deposited portion of the epitaxial layer 73 has the lowest impurity concentration, the concentration being least in the portion of the layer 73 immediately adjacent the P–N junction region, and greatest in the portion of the layer 73 adjacent the electrode 75. The net effect of maintaining the highest impurity concentration adjacent the device electrodes is to lower the contact resistance and provide exceptionally good ohmic characteristics for the device electrodes.

I claim:

1. A method of making a P–N junction, comprising the steps of:

providing a substrate having a first surface of substantially monocrystalline GaAs, growing on said first surface a first epitaxial N type layer of GaAs doped with Te by applying to said surface a first pre-heated solution comprising Ga, GaAs and Te and cooling said first solution to crystallize and thereby form said first layer, and growing on said first layer a second epitaxial P type layer of GaAs doped with Zn by applying to said first layer a second pre-heated solution comprising Ga, GaAs and Zn and cooling said second solution to crystallize and thereby form said second layer, the interface between said layers defining a first P–N junction.

2. A method according to claim 1, wherein said first solution is applied to said first surface at a temperature of between 880° C. and 920° C., and removed from said first surface when said first solution cools to about 400° C., and wherein said second solution is applied to a cleaned surface of said first layer at a temperature of between 910° C. and 950° C., and removed from said first layer when said second solution cools to about 400° C.

3. A process for manufacturing a P–N junction semiconductor device, comprising the steps of:

preparing a first melt comprising (i) gallium arsenide, (ii) a first impurity material capable of imparting a given conductivity type to gallium arsenide, and (iii) a solvent for gallium arsenide and said first impurity material;

immersing a substrate in said first melt;

slowly cooling the melt to precipitate therefrom, onto said substrate, a first monocrystalline layer comprising gallium arsenide of said given conductivity type;

preparing a second melt comprising (i) gallium arsenide, (ii) a second impurity material capable of imparting an opposite conductivity type to gallium arsenide, and (iii) a solvent for gallium arsenide and said second impurity material;

immersing an exposed surface of said first layer in said second melt; and cooling said second melt to precipitate therefrom onto said exposed surface a second monocrystalline layer comprising gallium arsenide of said opposite conductivity type, so that the interface between said layers defines said P–N junction;

one of said impurity materials exhibiting a normal solubility vs. temperature characteristic in its solvent and the other of said impurity materials exhibiting a retrograde solubility vs. temperature characteristic in its solvent.

4. A process according to claim 3, wherein said first impurity material comprises zinc and said second material comprises tellurium.

References Cited

UNITED STATES PATENTS

| | | | |
|---|---|---|---|
| 3,278,342 | 10/1966 | John et al. | 148—1.6 |
| 3,089,794 | 5/1963 | Marinace | 148—175 X |
| 3,309,553 | 3/1967 | Kroemer | 317—234 X |

OTHER REFERENCES

Nelson, H., R.C.A. Review 24, December 1963, pp. 603–615.

Hunter, L. P. Handbook of Semiconductor Electronics, McGraw-Hill (1962) chapt. 7.

Wolff et al., Phys .Rev. 94, p. 753–4 (1954).

Rupprecht, H., 1966 Symposium on GaAs, Paper No. 9, pp. 57–61.

Ditrick, N. H. & Nelson, H., R.C.A. Engineer, vol. 6, No. 2, August-September 1960, p. 19.

Trumbore et al., J. Appl. Phys., vol. 38, No. 4 (Mar. 15, 1967), pp. 1987–8.

HYLAND BIZOT, Primary Examiner

W. G. SABA, Assistant Examiner

U.S. Cl. X.R.

117—201; 148—1.5, 1.6, 172, 173; 252—62.3; 317—234, 235 N